United States Patent [19]

Ishii et al.

[11] Patent Number: 4,902,770

[45] Date of Patent: * Feb. 20, 1990

[54] UNDERCOATING MATERIAL FOR PHOTOSENSITIVE RESINS

[75] Inventors: Wataru Ishii, Hadano; Shozo Miyazawa, Chigasaki; Shinji Tsuchiya, Kanagawa; Hisashi Nakane, Kawasaki; Akira Yokota, Yamato, all of Japan

[73] Assignee: Tokyo Ohka Kogyo Co., Ltd., Kanagawa, Japan

[*] Notice: The portion of the term of this patent subsequent to Apr. 12, 2005 has been disclaimed.

[21] Appl. No.: 52,466

[22] Filed: May 20, 1987

Related U.S. Application Data

[62] Division of Ser. No. 708,940, Mar. 6, 1985, Pat. No. 4,702,992.

[30] Foreign Application Priority Data

Mar. 6, 1984 [JP] Japan ................................. 59-41231

[51] Int. Cl.$^4$ ..................... C08G 8/16; C14G 14/10; G03C 1/76
[52] U.S. Cl. ...................................... 528/149; 525/504; 528/162; 528/163; 430/160; 430/166; 430/167; 430/271
[58] Field of Search ............... 430/160, 166, 167, 271, 430/273, 523, 531; 528/149, 162, 163; 525/504

[56] References Cited

U.S. PATENT DOCUMENTS

| | | | |
|---|---|---|---|
| 3,402,044 | 9/1968 | Steinhoff | 430/192 |
| 3,813,261 | 5/1974 | Muller | 430/171 |
| 4,238,560 | 12/1980 | Nakamura et al. | 430/167 |
| 4,268,603 | 5/1981 | Sato | 430/197 |
| 4,287,289 | 9/1981 | Sato | 430/197 |
| 4,370,405 | 1/1983 | O'Toole et al. | 430/191 |
| 4,414,314 | 11/1983 | Kaplan et al. | 430/330 |
| 4,450,215 | 5/1984 | Reithel et al. | 430/7 |
| 4,737,438 | 4/1988 | Ito et al. | 430/197 |

FOREIGN PATENT DOCUMENTS 3246037 6/1984 Fed. Rep. of Germany ...... 430/175

*Primary Examiner*—Charles L. Bowers, Jr.
*Attorney, Agent, or Firm*—Wyatt, Gerber, Burke and Badie

[57] ABSTRACT

The undercoating composition of the invention, useful for providing an undercoating layer for a top coat of a photosensitive resist layer on a substrate surface, comprises, as a principal ingredient thereof, a condensation product obtained by the condensation reaction between a hydroxy-substituted diphenylamine and a melamine compound substituted on the nitrogen atoms with methylol groups and/or alkoxymethyl groups. The undercoating obtained of the composition is highly resistant against the attack by the overcoating solution applied thereon so that the fidelity of the pattern reproduction by the photolithographic technique is greatly improved by virtue of the absence of any disorder at the interface between the undercoating and top coat layers. The advantage is further increased when the undercoating composition further comprises a photoextinctive agent, e.g. a dye, having absorptivity in the wave length region where the photosensitive resist of the top coat has sensitivity.

7 Claims, No Drawings

UNDERCOATING MATERIAL FOR PHOTOSENSITIVE RESINS

This is a division of application Ser. No. 708,940 filed on March 6, 1985, U.S. Pat. No. 4,702,992.

BACKGROUND OF THE INVENTION

The present invention relates to an undercoating material for photosensitive resins or, more particularly, to an undercoating material for photosensitive resins useful in the pattern formation on the surface of various kinds of substrates such as semiconductor wafers by the techniques of forming a resist film of the so-called multilayer structure and etching as well as to a method for patterning on the surface of a substrate by the techniques of forming a resist film of the so-called multilayer structure using a unique undercoating material followed by etching.

In the prior art manufacturing process of semiconductor integrated circuits, for example, by forming an etched pattern on the surface of a substrate such as a wafer of a silicon semiconductor, it is usual that a surface film of a photosensitive resin called a resist is first formed on the substrate surface and the resist film is irradiated with actinic rays through a photomask bearing a pattern of the desired circuit to produce a difference in the solubility of the resist in a solvent called a developer between the areas irradiated and unirradiated with the actinic rays followed by development, i.e. partial dissolution, of the resist film to form a patterned resist layer on the substrate surface with partial exposure of the unprotected substrate surface. The substrate thus provided on the surface with a patterned resist layer is then subjected to a treatment of etching followed by the removal of the resist layer. It is not rare that the cycle of the above described steps is repeated several times when the finally desired integrated circuit is relatively complicated.

In recent years, remarkable progress has been made in the techniques of the above described microlithography as an example of the fine working technology. In photolithography utilizing a process of irradiation with light for patterning, in particular, photolithography of an extremely high precision in the so-called submicron region by exposure to light is or will be no longer unimaginable in contrast to the hitherto accepted general understanding of impossibility by virtue of the improvements accomplished in connection with the accuracy in the photomask alignment, development of an instrument for exposure of the step-and-repeat type capable of giving a high resolving power, construction of the optical system and other advances although several important technical problems are left unsolved in order to achieve reproduction of the fine pattern of the photomask on the substrate with full precision despite the above mentioned several improvements in relation to the instruments undoubtedly facilitating fine working.

It is noteworthy that the flatness or degree of levelling on the surface of the substrate as a base of the semiconductor integrated circuit is not always high enough due to the unavoidable presence of several types of roughness and difference in levels. The ruggedness or difference in levels on the substrate surface is one of the major causes having adverse influences on the uniformity of thickness of the resist film provided on the surface with localized variations in the film thickness which is larger in the recessed areas than in the raised areas. Consequently, it is usual that the surface coated with a resist exhibits a wavy or undulating appearance. Such an unevenness in the thickness of the resist film directly influences the uniformity of the sensitivity characteristics of the resist film adversely affecting the results of patterning. Further, the irregularity on the substrate surface may cause diffused reflection of the projected light so that the accuracy in the dimensions of the desired pattern and the resolving power for fine patterns are greatly decreased.

As a trend in recent years, as is mentioned above, step-and-repeat type exposure instruments by projection of light called a "stepper" are increasingly introduced into the production lines of semiconductor devices by virtue of the superiority in the high resolving power replacing the conventional contact-type exposure instruments. The achievement in the steppers in respect of the high resolving power is obtained at a monochromatic wave length of light of, for example, 436 nm by the improvements in the light source or the optical system while a problem in the photolithography utilizing a monochromatic light is the generation of standing waves readily taking place, in particular, on a well-levelled substrate surface with little ruggedness.

In order to achieve further improved patterning with a high resolving power, accordingly, the above described problems must be solved by all means and it is required therefore to decrease the roughness of the substrate surface, to reduce the reflection of light on the substrate surface and, in the same time, to prevent generation of standing waves.

With an object to satisfy these requirements, proposals and attempts have been made in recent years for providing a resist film of a multilayered structure on the substrate surface. As an example of such a method of multilayered resist, a method of three-layered resist is proposed in which a substrate surface having differences in level is imparted with an increased degree of levelling by providing a relatively thick coating layer of an organic resin as an undercoating on which a thin layer of a metal or an inorganic compound formed, for example, by the CVD method and a top layer of a resist are successively provided. Although advantageous in respect of the high resolving power and high aspect ratio of the pattern formed by the method, a great disadvantage in this method is the low productivity due to the complicacy of the process to cause an extreme decrease in the throughput.

Alternatively, a method of bilayered resist is also under development in which the problem of the complicacy of the process in the above described three-layered resist can be at least partly solved without affecting the accuracy of pattern reproduction. In this method, the substrate surface is first provided with an undercoating layer of an organic resin capable of increasing the degree of levelling and reducing the reflection of light on the surface and a top coat of a resist material is provided thereon. This method, however, involves several problems and disadvantages left unsolved. For example, intermixing dissolution may sometimes take place between the undercoating and the top coat of the resist at the interface when an organic solution of the resist material is applied to the surface of the undercoating of the organic resin so that roughness is formed on the topmost surface of the bilayer consequently resulting in decreased uniformity in the thickness of the binary coating layer as a whole. In addition, the solubility behavior of the bilayer is somewhat different from the intended one in the areas where such an intermixing dissolution has taken place between the undercoating and the top coat. In such a case, at any rate, no high-fidelity reproduction of the pattern of the photomask can be obtained with a desired high precision due to the drawbacks of a decreased resolving power and incomplete development.

Accordingly, measures are taken to prevent the intermixing dissolution by subjecting the surface of the undercoating to a certain treatment prior to the application of the top coat solution thereto. A more conventional means therefor is, however, to select and use an undercoating material exhibiting a solubility behavior in a solvent quite different from that of the top coat. Exemplary of such a combination of the undercoating material and the resist material in the top coat are, for example, a combination of a rubber-based negative-working photoresist material as the undercoat and an alkali-soluble positive-working photoresist material as the top coat and a combination of a poly(methyl methacrylate) or a poly(isopropenylketone) containing a dye as the undercoating material and an alkali-soluble positive-working photoresist material as the top coat as proposed in Japanese Patent Kokai 58-51517. This method of selecting and using a combination of the undercoating and top coat quite different in the solubility behavior from each other is, however, disadvantageous in the complicacy of the process because such a bilayered resist layer requires a two-step treatment in the development after the patternwise exposure to light due to the quite different solubility behaviors of the undercoat and the top coat although this is a favorable condition to facilitate formation of the bilayered coating.

SUMMARY OF THE INVENTION

An object of the present invention is therefore to provide a novel undercoating material suitable for use in the preparation of a bilayered photoresist film on a substrate surface without the above described problems and disadvantages in the prior art materials.

Another object of the invention is to provide a novel method for the preparation of a bilayered photoresist film on a substrate surface by use of the novel undercoating material below the top coat of a photosensitive resin.

Thus, the undercoating composition of the invention for the preparation of a bilayered or multi-layered photoresist film comprising an undercoating layer and a top coat layer of a photosensitive resist on the surface of a substrate comprises, as a principal ingredient thereof, a condensation product formed by the condensation reaction, which can take place in the presence of an acid catalyst also serving as a reaction medium, between (a) a hydroxydiphenylamine compound represented by the general formula

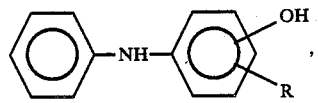

in which R is a hydrogen atom or a hydroxy group, and (b) a melamine compound modified with formaldehyde or an alcohol and formaldehyde. The above mentioned condensation product is a novel compound not known hitherto or not described in any prior art literatures.

Accordingly, the method of the present invention for the preparation of a bilayered or multi-layered photoresist film on the surface of a substrate comprises, prior to the application of a photosensitive resin to the surface of a substrate, coating the surface of the substrate with an undercoating solution in a specific organic solvent comprising a condensation product formed by the condensation reaction, which can take place in the presence of an acid catalyst also serving as a reaction medium, between (a) a hydroxydiphenylamine compound represented by the general formula (I) given above and (b) a melamine compound modified with formaldehyde or a combination of an alcohol and formaldehyde.

The performance of the above described undercoating composition comprising the specific condensation product as the principal ingredient thereof can further be improved by admixing the composition with a photoextinctive compound capable of absorbing light in the wave length region where the photosensitive resin in the top coat layer has sensitivity to light.

DETAILED DESCRIPTION OF THE PREFERRED EMBODIMENTS

The condensation product as the principal constituent in the inventive undercoating material can readily be prepared by the condensation reaction between the components (a) and (b). Several of the examples of the hydroxydiphenylamine compound, represented by the general formula (I) above, as the component (a) include 2-, 3- and 4-hydroxydiphenylamines; 2,4- and 3,5-dihydroxydiphenylamines and the like. The monohydroxy-substituted compounds are preferred. They can be used either singly or as a mixture of two kinds or more according to need.

The solubility behavior of the condensation product obtained from these hydroxy-substituted diphenylamine compounds depends to some extent on the position of substitution by the hydroxy group on the benzene nucleus. Therefore it is preferable to appropriately select the condensation product in relation to the position of the hydroxy-substitution according to the particular object and application of the undercoating material which may be prepared of any type of the condensation products or a combination of them. For example, a higher solubility of the condensation product is obtained in an alkaline solution when the hydroxy-substitution is at the 4-position relative to the diphenylamine nitrogen atom than at the 3-position so that the solubility of an alkali-developable photoresist layer can be controlled by use of a combination of two types of the condensation products in an appropriate proportion. In particular, a solubility behavior with good controllability and reliability in an alkaline developer solution is obtained when 70 to 95% by weight of the combined diphenylamine compounds is the 4-hydroxy-substituted one.

The other reactant, i.e. the component (b), pertaining to the condensation reaction with the hydroxydiphenylamine compound is a melamine compound modified with formaldehyde or with a combination of formaldehyde and an alcohol. Such a modified melamine compound is a methylolmelamine or an alkoxylation product thereof and can be prepared by the reaction of melamine with formalin or by the reaction of the methylolmelamine with an alcohol having 1 to 4 carbon atoms in a molecule according to a known procedure. The modified melamine compound is represented by the general formula

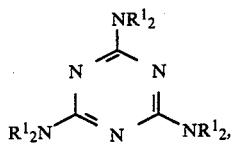

(II)

in which at least one of the 6 groups denoted by $R^1$ is a methylol or an alkoxymethyl group and the remainder of the groups $R^1$, if any, are selected from the class consisting of hydrogen atoms, methylol groups and alkoxymethyl groups, the alkyl group of each alkoxy group having 1 to 4 carbon atoms. In addition to the monomeric melamine compound represented by the general formula (II) above, mixtures thereof with an oligomer such as dimers, trimers and so on are also suitable although the content of the oligomers in the mixture should desirably be controlled not to exceed a few % by weight by appropriately selecting the conditions in the modification reaction. An excessively large content of the oligomers may cause troubles in the preparation and application of the coating solution due to the decreased solubility of the condensation product in organic solvents specifically proposed for the condensation product.

Among the above described possible modified melamine compounds, preferable ones are those having, in a monomeric unit, at least one or, more preferably, from 2 to 4 methylol groups or from 1 to 4 alkoxymethyl groups bonded to the nitrogen atoms of the melamine molecule. Such a modified melamine compound can readily be obtained as a class of several commercial products sold on the market under the tradenames of, for example, Nikalack manufactured by Sanwa Chemical Co., Nikaresin manufactured by Nippon Carbide Co. and the like, sometimes, in the form of a mixture of methylolmelamines of different degrees of substitution.

The condensation product as the principal constituent of the inventive undercoating material can be prepared by the condensation reaction of the above described hydroxydiphenylamine compound and the modified melamine compound under agitation in the presence of an acid catalyst which may be an inorganic acid such as hydrochloric acid, phosphoric acid, sulfuric acid and the like and organic acid such as formic acid, oxalic acid and the like. Phosphoric acid, sulfuric acid and mixtures thereof are preferred among them in view of the easiness in the control of the degree of condensation as a determinant factor of the solubility of the resultant condensation product. The amount of these acids should be at least equal to or, preferably, at least twice by weight of the reactants and phosphoric and sulfuric acids may serve as a reaction medium without any diluent excepting the unavoidably contained water therein. Water may be added to the reaction mixture with an object to increase the solubility of the modified melamine compound therein, if necessary. In such a case of using the acid as the reaction medium, it may be too much to say that the consistency of the reaction mixture is unduly high in a semi-solid state with a too small amount of the acid to cause a great difficulty in the agitation of the mixture.

Although widely dependent on the kinds of the reactant compounds and other conditions, the temperature of the condensation reaction is usually selected in the range from 15° to 70° C. and the reaction proceeds exothermically. It is preferable, however, that the reaction is started at about room temperature even when the intended reaction temperature is lower than room temperature in view of the slow starting of the reaction at a temperature substantially lower than room temperature and thereafter the temperature of the reaction mixture is controlled at the desired temperature within the above specified range so that the reaction may proceed at a moderate velocity. An excessively high reaction temperature is undesirable due to the possible gelation taking place in the reaction mixture.

The weight ratio of the hydroxydiphenylamine compound to the modified melamine compound in the reaction mixture is also important in order to obtain a satisfactory result of the reaction. The increase in the amount of the latter reactant may cause an increased danger of gelation of the reaction mixture as the reaction proceeds while the increase in the amount of the former reactant may unduly increase the solubility of the resultant condensation product. Accordingly, it is preferable that the amount of the modified melamine compound is in the range from 1 to 60% by weight or, more preferably, from 25 to 55% by weight based on the overall amount of the two reactant compounds.

It is noted that the average degree of polymerization or molecular weight of the condensation product is increased as the reaction time is extended with the increase in the viscosity of the reaction mixture and decrease in the solubility of the condensation product correspondingly although the increase in the viscosity of the reaction mixture and decrease in the solubility of the product level off after 48 to 72 hours of the reaction and are kept approximately constant thereafter.

The thus obtained polymeric condensation product is soluble in special organic solvents of limited types. Exemplary of such special solvents are polar organic solvents including N-methyl-2-pyrrolidone, N-acetyl-2-pyrrolidone, dimethyl sulfoxide, N-methylformamide, dimethylacetamide, dimethylformamide and the like as well as mixtures thereof. Some non-polar solvents can be mixed with these polar solvents though in a limited proportion. Characteristically, the condensation product is also soluble without difficulty in an inorganic or organic aqueous alkaline solution.

The above described polymeric condensation product of the hydroxydiphenylamine compound and the modified melamine compound is useful as such as an undercoating material of photosensitive resins. It is, however, more advantageous that the reflection-preventing power of the condensation product is increased by admixing with a photoextinctive agent having absorptivity of light in the wavelength region where the photosensitive resin to be provided thereon exhibits photosensitivity by virtue of the preventing effect on the diffused or irregular reflection of light by the ruggedness of the substrate surface and the standing waves by the reflection of light on the substrate surface. In consideration of the photosensitivity characteristics of the commercially available photoresist materials that the rubber-based negative-working ones are sensitive in the wavelength region from 250 to 480 nm with the maximum at about 360 nm and the positive-working ones are sensitive in the wavelength region from 250 to 480 nm with the maximum at about 400 nm, exemplary of such a photoextinctive agent are the dyes including Coumarine 7, Coumarine 314, Coumarine 338, Quinoline Yellow, magneson, C.I. Basic Yellow 2, C.I. Solvent Yellow 82, C.I. Solvent Yellow 33 (C.I. 47000), C.I. Disperse Yellow 228, C.I. Disperse Yellow 54, C.I.

Solvent Yellow 151, C.I. Solvent Yellow 93, C.I. Solvent Yellow 201, C.I. Solvent Orange 80, Oil Yellow 18 (a product by Shirado Chemical Co.), 4-hydroxy-4'-dimethylaminoazobenzene and the like each exhibiting a specific solubility behavior. These photoextinctive agents can be used either singly or as a mixture of two kinds or more. The amount of such a photoextinctive agent in the undercoating material should be at least 1% by weight or, preferably, in the range from 5 to 40% by weight based on the polymeric condensation product in order to effectively exhibit the desired reflection-preventing effect. When the amount thereof is too small, the desired reflection-preventing effect cannot be obtained as a matter of course while, on the other hand, incomplete dissolution of the photoextinctive agent or subsequent precipitation of the once dissolved photoextinctive agent is sometimes unavoidable when the amount thereof is excessively large.

The undercoating material of the invention is useful on a substrate having level differences or roughness on the surface when levelling is desired thereof. The thickness of the undercoating layer should be at least 0.1 $\mu$m when a reflection-preventing effect is desired of the layer while the undercoating layer should have a thickness sufficient to give a complete levelling of the substrate surface which is, for example, at least 1 $\mu$m depending on the degree of roughness on the substrate surface. Although such an effect of levelling can be obtained of course with the polymeric condensation product as such, it is more advantageous to use the condensation product admixed with the above mentioned photoextinctive agent with the combined effects of surface levelling and reflection preventing.

In connection with the manner of using the above described undercoating material of the invention, a solution of the polymeric condensation product with optional admixture of the photoextinctive agent in an organic solvent is uniformly applied to the substrate surface by use of a spinner and the like coating instrument followed by drying with heating at a temperature in the range from 90° to 200° C. or, preferably, from 120° to 170° C. The length of time taken for the drying treatment naturally depends on the temperature and the manner of drying and a time of at least 10 minutes or, preferably, 20 to 60 minutes may be sufficient when a hot-air oven is used for drying but the time can be shortened to 1 minute at the shortest or, preferably, 2 to 10 minutes when a hot plate is used for drying.

The undercoating layer formed of the inventive undercoating material is then provided thereon with a top layer of a photosensitive resin composition which may be any of the conventional materials available on the market. Examples of the photosensitive resin compositions now available on the market include OFPR, OMR, ONNR and OEBR series products sold by Tokyo Ohka Kogyo Co., AZ series products sold by Shipley Co. and KPR series products sold by Kodak Co. Particularly preferable are the positive-working resist materials of the quinone diazide type and naphthoquinone diazide type and negative-working resist materials of the rubber-based types.

One of the advantages obtained by the use of the inventive undercoating material is that no specific surface treatment of the undercoating layer is required prior to the application of the photosensitive resist material thereon. This means that the inventive undercoating material is particularly useful in the preparation of a multilayered resist film on a substrate.

It is not essential that the overcoating layer provided directly on the undercoating layer formed of the inventive undercoating material is a photosensitive resin. In a three-layered photoresist method, for example, the surface of the undercoating layer is first coated with a thin film of a metal or an inorganic compound as an intermediate layer, which is insoluble in an organic solvent but removable by Freon plasma and the like means, and the top coat layer of a photosensitive resin is provided thereon.

By virtue of the good solubility of the inventive undercoating material in several specific organic solvents and organic aqueous solutions containing organic or inorganic alkaline solutes, a great advantage is obtained by providing an alkali-soluble positive-working photoresist layer on the surface of the undercoating layer formed by the application of an organic solution of the inventive undercoating material because a single developing treatment with an alkaline developer solution following a patternwise exposure to light can produce a masking pattern for etching on the substrate surface so as to completely eliminate the troublesomeness in the conventional complicated process in the prior art multilayered resist method. In addition, the inventive undercoating material is very stable and storable over a long period of time with little danger of denaturation or degradation by, for example, gelation. Needless to say, the inventive undercoating material has absolutely no problem in the film-formability and adhesion of the film to the substrate surface on which the undercoating layer is formed.

A further great advantage obtained by use of the inventive undercoating materials is that the top coat of the photosensitive resin, irrespectively of the type thereof, in the form of a solution can be provided directly on to the surface of the undercoating layer absolutely without any pre-treatment of the surface in contrast with the conventional bilayer resist method in which it is essential to undertake a certain pre-treatment of the undercoating surface prior to the application of the top coat thereon or to select a photosensitive resin as the top coat resist having a solubility behavior quite different from that of the undercoating resulting in unavoidable troublesomeness in the subsequent process of pattern formation since otherwise the surface of the first formed undercoating layer is attacked by the coating solution of the top coat resist subsequently applied thereto. Thus, the present invention provides a means of great simplification of the process, in particular, in the multilayered resist method in comparison with the conventional processes in the prior art.

The inventive undercoating material can exhibit an effect of levelling and is capable of forming an undercoating layer with a particularly high reflection-preventing effect so that the material is advantageously used in the exposure liable to generate standing waves as in the step-and-repeat type exposure. Furthermore, the inventive undercoating material has effects to improve the dimensional accuracy of the pattern and to increase the latitude of exposure in comparison with other conventional undercoating materials by virtue of the effect of levelling in the areas with level difference or ruggedness on the substrate surface and reduction of the dimensional difference caused by conversion due to the irregular reflection of light.

In the following, the present invention is described in more detail by way of the description for the preparation of the inventive undercoating materials and the use thereof.

Preparation 1

Into 600 g of 85% phosphoric acid in a glass beaker of 1 liter capacity warmed on a water bath kept at 30° C. were added 200 g of 4-hydroxydiphenylamine under agitation and, when the mixture was completely clear by the dissolution of the reactant in the acid, 100 g of a melamine derivative mainly composed of pentabutoxymethyl monomethylol melamine (Nikalack MW22A, a product by Sanwa Chemical Co.) were gradually added to the mixture followed by agitation. The rate of introduction thereof was controlled with outer cooling so as to avoid rapid increase of the temperature of the mixture which had started to increase as the first portion of the melamine derivative was added as a result of the exothermic reaction taking place. After completion of the introduction of the whole amount of the melamine derivative, agitation of the reaction mixture was continued for further 2 hours at the same temperature and then the temperature of the water bath was increased to 40° C. where agitation was continued for additional 24 hours. Thereafter, the reaction mixture having an increased viscosity over that at the beginning stage of the reaction was continuously and slowly added dropwise into 20 liters of pure water in a stainless steel vat of 30 liters capacity under vigorous agitation. The reaction mixture, having a high viscosity, fell into the vat with threading. After completion of the addition of the whole volume of the reaction mixture into water, the mixture was agitated for 1 hour and the precipitated condensation product was collected by filtration with suction and washed by agitating in 10 liters of pure water followed by second filtration. This cycle of washing and filtration was repeated until the filtrate was definitely neutral and the thus washed precipitates were dried for 24 hours in an air-circulation oven at 80° C.

The thus obtained condensation product was in a brownish black particulate form and could readily be pulverized into a fine powder. The yield of the condensation product was good corresponding to about 90% of the theoretical yield.

Preparations 2 to 18

The procedure in each of the preparations was substantially the same as in Preparation 1 described above except that the types of the hydroxydiphenylamine compound and the modified melamine compound and the amounts thereof as well as the reaction conditions including the kind and amount of the reaction medium, i.e. acid catalyst, and the reaction temperature and time were as indicated in the Table given below. The yields of the thus prepared condensation products given in the same table were each at least 60% of the theoretical value.

In the table, the hydroxydiphenylamine compounds and the modified melamine compounds are indicated with the following numbers.

Hydroxydiphenylamine compound
 I: 4-Hydroxydiphenylamine
 II: 3-Hydroxydiphenylamine
Modified melamine compound

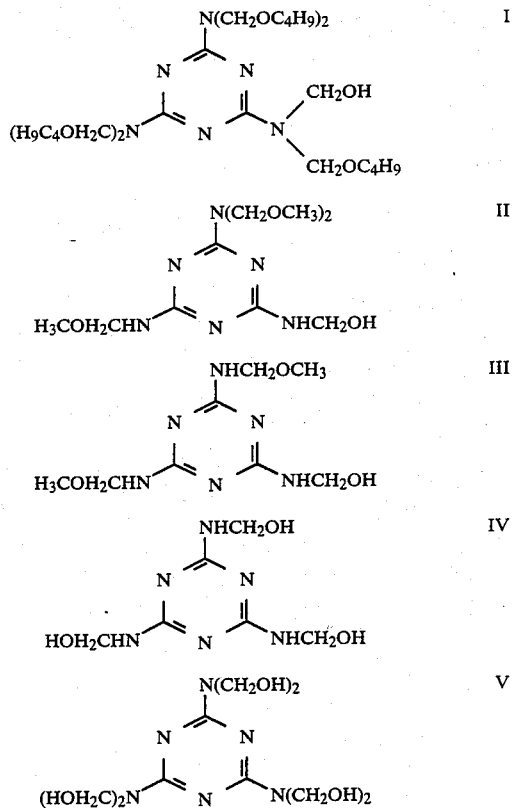

TABLE

| Preparation No. | Hydroxydiphenylamine (g taken) | Modified melamine (g taken) | Water added, g | Acid (g taken) | Reaction temperature, °C. | Reaction time, hours | Yield, g |
|---|---|---|---|---|---|---|---|
| 1 | I (200) | I (100) | — | 85% $H_3PO_4$ (600) | 40 | 24 | 240 |
| 2 | I (200) | I (100) | — | 85% $H_3PO_4$ (600) | 40 | 72 | 260 |
| 3 | I (200) | I (100) | — | 85% $H_3PO_4$ (600) | 50 | 72 | 260 |
| 4 | I (200) | I (200) | — | 85% $H_3PO_4$ (600) | 50 | 72 | 370 |
| 5 | I (200) | II (100) | — | 85% $H_3PO_4$ (600) | 50 | 72 | 270 |
| 6 | I (200) | III (100) | — | 85% $H_3PO_4$ (600) | 50 | 72 | 260 |
| 7 | I (200) | III (100) | — | 85% $H_3PO_4$ (600) | 60 | 72 | 270 |
| 8 | I (200) | IV (100) | 100 | 85% $H_3PO_4$ (600) | 50 | 72 | 260 |
| 9 | I (200) | IV (100) | 100 | 85% $H_3PO_4$ (600) | 60 | 72 | 260 |

TABLE-continued

| Preparation No. | Hydroxy-diphenyl-amine (g taken) | Modified melamine (g taken) | Water added, g | Acid (g taken) | Reaction temperature, °C. | Reaction time, hours | Yield, g |
|---|---|---|---|---|---|---|---|
| 10 | I (200) | IV (100) | 100 | 98% $H_2SO_4$ (100) | 55 | 72 | 270 |
| 11 | I (200) | V (100) | — | 85% $H_3PO_4$ (600) | 50 | 24 | 250 |
| 12 | I (200) | V (100) | — | 85% $H_3PO_4$ (600) | 40 | 72 | 260 |
| 13 | II (200) | IV (100) | 100 | 85% $H_3PO_4$ (600) | 40 | 72 | 260 |
| 14 | I (120) | IV (80) | 80 | 85% $H_3PO_4$ (500) | 50 | 72 | 140 |
| 15 | I (120) | IV (80) | 80 | 85% $H_3PO_4$ (500) | 70 | 7 | 137 |
| 16 | I (114) II (6) | IV (75) | 75 | 85% $H_3PO_4$ (500) | 50 | 60 | 135 |
| 17 | I (108) II (12) | IV (70) | 70 | 85% $H_3PO_4$ (500) | 50 | 24 | 120 |
| 18 | I (108) II (12) | IV (70) | 70 | 85% $H_3PO_4$ (500) | 50 | 48 | 125 |

EXAMPLE 1

Each 1.5 g portion of the condensation products obtained in Preparations 1 to 4 was admixed with about 0.3 g of 4-hydroxy-4'-dimethylaminoazobenzene as a dye and dissolved in 8.5 g of dimethylacetamide followed by filtration through a membrane filter of 0.45 μm pore size to give a coating solution for testing. The substrate was prepared by coating a 3-inch silicon wafer provided with a $SiO_2$ pattern of about 1 μm depth with an aluminum layer of 600 to 800 nm thickness by vacuum vapor deposition. Coating of the thus prepared substrate was performed by putting a few drops of the coating solution on the substrate mounted on a spinner rotating at 600 r.p.m. for the first 3 seconds and then at 4000 r.p.m. for the subsequent 40 seconds. The thus coated silicon wafers were each dried and baked on a hot plate in a resist coater for 5 minutes each at a temperature of 130° to 180° C. set with 10° C. intervals to form a layer of undercoating.

Immediately following the above mentioned drying and baking of the undercoating, a commercial product (OFPR 800, a product by Tokyo Ohka Kogyo Co.) of a photosensitive resist material was applied as an overcoating on to the thus formed undercoating layer by use of a spinner rotating at 4000 r.p.m. for 20 seconds followed by drying on a hot plate at 110° C. for 90 seconds. No attack was noted on the undercoating layer by the application of the overcoating solution and a bilayer resist coating could be obtained quite satisfactorily.

Thereafter, the thus formed photosensitive resist layer was subjected to a divisional multi-step contacting exposure to light on a mask aligner (Model PLA 500, manufactured by Canon Co.) in eight steps of 4.6 seconds to 6.0 seconds with 0.2 second intervals. The intensity of light for the exposure was about 6.2 mW/cm² at a wavelength of 365 nm. The development of the thus patternwise exposed photoresist layer was performed by dipping in an about 2% by weight aqueous solution of tetramethylammonium hydroxide as a developer solution at 23° C. for 75 to 80 seconds followed by rinse for 30 seconds in water and drying by spinning. The result was that the bilayer resist could be developed in a single development treatment to give a patterned resist layer with high fidelity to the mask pattern. Microscopic inspection of the width of the patterned line on both sides of a portion crossing a boundary of the areas having a level difference on the underlying substrate surface revealed that the difference in the line widths between the raised and recessed areas was clearly smaller than in the single-layer resist method indicating the effectiveness of the inventive undercoating material in preventing undesirable reflection.

EXAMPLE 2

An undercoating solution was prepared by dissolving 1.5 g of the condensation product obtained in Preparation 3 and about 0.3 g of magneson in 8.5 g of dimethylacetamide. The substrate material was a silicon wafer provided on the surface with a $SiO_2$ layer having a level difference of about 1 μm and coated with an aluminum layer having a thickness of 600 to 800 nm formed by vapor deposition. Coating of the substrate with the undercoating solution was performed in about the same manner as in Example 1 except that the temperature of drying on the hot plate was always 160° C. The same procedures as in Example 1 were undertaken for providing the top coat with the photosensitive resist (OFPR 800, supra), drying thereof and patternwise contacting exposure of the photoresist layer to light followed by rinse with water and spin-drying. The exposure time was 5.2 seconds. The thus formed line pattern had good fidelity to the mask pattern and the measurement of the line width by use of a line-width measuring instrument (manufactured by Hitachi Denshi Co.) indicated a decreased difference in the line widths between the raised and recessed areas just facing the boundary line with a level difference.

EXAMPLE 3

Undercoating solutions were prepared each by dissolving the condensation product obtained in Preparation 3 and Coumarine 7 as a dye in a varied amount of 1, 5, 10 or 20% by weight of the condensation product in dimethylacetamide in such amounts that the concentration of the condensation product in each solution was about 15% by weight.

The substrate was the same silicon wafer as used in Example 1 and coated with one of the above prepared undercoating solutions by spinning followed by drying at 160° C. for 5 minutes to give an undercoating layer of about 200 nm thickness. The same procedures were undertaken for overcoating with the photosensitive resist material, multi-step exposure to light and development of the patternwise exposed resist layer followed by rinse and drying. Microscopic inspection of the thus formed line pattern of the resist indicated a partial undeveloped area when the exposure time was 5.2 seconds or shorter while the development was complete on the areas exposed for longer exposure times. The measurement of the line widths on the recessed and raised areas on both sides of a bounderay line with level difference undertaken in the same manner as in Example 2 clearly indicated the effect of the varied amount of the dye. Namely, the effect of the dye was insignificant when the amount thereof was 5% by weight or smaller while the effect was very significant and increasing with the increase in the amount of the dye addition thereover.

Though as just expected, the absorbance of the undercoating layers formed on quartz glass plates by coating with the undercoating solutions was increased as the amount of the dye was increased as evidenced by the spectrophotometric determination in the ultraviolet region.

EXAMPLE 4

The experimental procedure was about the same as in Example 3 above except that Coumarine 7 as the photoextinctive dye in each undercoating solution was replaced with the same amount of Coumarine 314. The results were substantially the same as in Example 3.

EXAMPLE 5

The experimental procedure was about the same as in Example 3 except that Coumarine 7 as the photoextinctive dye in each undercoating solution was replaced with the same amount of Coumarine 338. The results were also substantially the same as in Example 3.

EXAMPLES 6 to 8

The undercoating solutions used in these Examples were the same ones as prepared and used in Examples 3, 4 and 5, respectively.

In each of the Examples, a silicon wafer was coated with the undercoating solution in the same manner as in Example 2 followed by drying and then provided with a photosensitive top coat layer of a commercially available rubber-based negative-working resist material (OMR 85, a product by Tokyo Ohka Kogyo Co.) by spin-coating on a resist coater followed by drying at 110° C. for 90 seconds. The thickness of this top coat layer was about 1 μm on flat areas having no level difference. No intermixing dissolution was noted in the undercoating layer by the application of the overcoating solution to give a quite satisfactory bilayer resist film.

The thus formed resist layer was then subjected to a contacting exposure on a mask aligner for 2.4 seconds through a standard patterned mask. Since the development treatment in this case could not be completed in a single step, the development was performed stepwise as follows. Namely, the first step of the development treatment was performed by use of the developer solution and the rinse liquid recommended by the producer of the photoresist material kept at 23° C. according to the standard procedure followed by drying in a hot-air oven at 80° C. for 1 minute. The development treatment was complete in the top coat layer of the photoresist alone to give a patterned resist layer with no noticeable changes on the undercoating layer. Thereafter, the second step development was performed by dipping the wafer for 30 seconds in a developer solution prepared by diluting the same developer solution as used in Example 1 with the same volume of water and kept at 23° C. followed by rinse with water for 30 seconds and spin-drying. The microscopic inspection of the thus formed patternwise resist layer indicated that the development of the undercoating layer was fairly satisfactory with good fidelity to the pattern of the overcoating resist layer though with a slight incompleteness in some areas on the substrate surface. The difference in the line widths on both sides of a boundary line with a level difference was clearly smaller as indicated by the measurement by use of a telecomparator than in a single-layered resist pattern formed by the development treatment concurrently undertaken. This effect was noted commonly in Examples 6, 7 and 8 and the increase in the amount of the photoextinctive dye had about the same effect as in Example 3 as a trend.

EXAMPLE 9

An undercoating solution was prepared by dissolving the condensation product obtained in Preparation 5 in dimethylacetamide in a concentration of 15% by weight followed by the admixture of 4-hydroxy-4'-dimethylamino azobenzene in an amount of about 10% by weight of the condensation product. The preparation of the photoresist bilayer, patternwise exposure thereof and development were performed using the above prepared undercoating solution otherwise in the same manner as in Example 1 except that the time of the development was 65 seconds. The results were that the development was somewhat incomplete with an exposure time of 5.4 seconds or shorter while good development was obtained in the undercoating layer, especially, in finely patterned areas of 2 μm line width or smaller when the exposure time was 5.8 seconds or longer. The effectiveness of the undercoating layer as a reflection-preventing film was clearly indicated by the microscopic inspection and line width measurement on the areas where the exposure time was 5.8 seconds or longer.

EXAMPLE 10

The experimental procedure was substantially the same as in Example 1 excepting the use of an undercoating solution prepared in the same manner as in Example 9 but with the condensation product obtained in Preparation 6 and Quinoline Yellow as the photoextinctive dye in an amount of 15% by weight of the condensation product. The results were substantially the same as in Example 9.

EXAMPLE 11

The experimental procedure was substantially the same as in Example 10 except that the undercoating solution was prepared using the condensation product obtained in Preparation 7 instead of Preparation 6 to find that similar effects were confirmed by the line width measurement. An additional advantage was that the disorder in the line pattern was still less significant as a result of the increased resistance of the undercoating layer against the attack of the developer solution by virtue of the use of a condensation product having a moderate solubility in an alkaline solution imparted by the reaction at a higher reaction temperature than in Preparation 6.

EXAMPLE 12

An undercoating solution was prepared in the same manner as in Example 9 excepting the replacement of the condensation product obtained in Preparation 5 with that obtained in Preparation 10 and 4-hydroxy-4'-dimethylamino azobenzene with Quinoline Yellow. The preparation of the photoresist bilayer, exposure and development treatment were undertaken by use of the above prepared undercoating solution in substantially the same manner as in Example 1 except that the exposure time was 5.6 seconds over whole substrate surface instead of the multi-step exposure. The results were that the development was quite satisfactory with no disorder in the line pattern as confirmed by the microscopic inspection and line width measurement by virtue of the moderate solubility of the undercoating layer in an alkaline solution.

EXAMPLE 13

The experimental procedure was substantially the same as in Example 1 excepting the use of an undercoating solution prepared by dissolving 2.0 g of the condensation product obtained in Preparation 16 and 0.6 g of magneson in 16 g of dimethylacetamide. The result of the pattern formation was that the accuracy of the line width was excellent with high fidelity to the mask pattern.

EXAMPLE 14

The experimental procedure was substantially the same as in Example 1 excepting the use of an undercoating solution prepared by dissolving 1.0 g of the condensation product obtained in Preparation 17 and 0.3 g of magneson in 8.5 g of dimethylacetamide. The results were as satisfactory as in Example 1.

EXAMPLE 15

The experimental procedure was substantially the same as in Example 1 excepting the use of an undercoating solution prepared by dissolving each 1.0 g of the condensation products obtained in Preparations 14 and 18 and 0.7 g of magneson in 16 g of dimethylacetamide. The results were very satisfactory with a high accuracy of the line pattern and with a very small difference in the line widths on both sides of a boundary line with a level difference along a line crossing thereover.

EXAMPLE 16

The experimental procedure was substantially the same as in Example 1 excepting the use of an undercoating solution prepared by dissolving each 1.0 g of the condensation products obtained in Preparations 14 and 15 and 0.6 g of magneson in 16 g of dimethylacetamide. The results of the pattern formation were that the difference in the line widths caused by the image conversion was very small with no noticeable disorder in the line pattern caused by the influence of the standing waves to establish the usefulness of the inventive undercoating material.

EXAMPLE 17

The experimental procedure was substantially the same as in Example 1 excepting the use of an undercoating solution prepared by blending a first and a second solution in a proportion of 4:5 by weight, each of the solutions being prepared by dissolving 3.0 g of the condensation product obtained in Preparation 14 or Preparation 16, respectively, and 1.0 g of magneson in 25 g of dimethylformamide. The results of the pattern formation were that the dimensional accuracy of the line pattern was very high with good fidelity to the mask pattern with no noticeable disorder in the pattern caused by the influence of the standing waves.

EXAMPLE 18

The experimental procedure was substantially the same as in Example 1 excepting the use of an undercoating solution prepared by dissolving each 1.0 g of the condensation products obtained in Preparations 14 and 18, 0.6 g of magneson and 0.1 g of C.I. Disperse Yellow 228 dye in 16 g of dimethylacetamide. The results of the pattern formation were that the difference in the line widths caused by the image conversion was very small with good fidelity to the mask pattern showing no noticeable disorder in the pattern by the influence of the standing waves to establish the usefulness of the inventive undercoating material.

EXAMPLE 19

Two undercoating solutions were prepared each by dissolving the condensation product obtained in Preparation 14 or 15 in N-methylformamide in a concentration of about 22% by weight.

Silicon wafers of 3 inches diameter having a roughness of 1.0 μm at the largest were each first provided with a coating layer of aluminum metal of 0.3 μm thickness by the vacuum vapor deposition and then coated with one of the above prepared undercoating solutions by putting a few drops of the solution on the wafer which was rotated at 500 r.p.m. for the first 3 seconds and then at 2500 r.p.m. for the subsequent 80 seconds. Each of the solutions gave an undercoating layer of the condensation product having a smooth and flat surface. The thus undercoated silicon wafer was then baked at 160° C. for 5 minutes and the cross section thereof was examined with a scanning electron microscope to find that the recessed portions having a depth of 1.0 μm at the largest were completely filled with the undercoating resin.

Further, a top coat layer of a photoresist was provided on the undercoating layer in the same manner as in Example 1 and subjected to the patterning treatment. The results were that the resolving power of the reproduced pattern was substantially improved in comparison with the pattern produced without the undercoating layer although the degree of the improvement was somewhat less significant than in Example 1.

What is claimed is:

1. An undercoating composition for the preparation of a bilayered photoresist film composed of an undercoating layer and a top coat layer of a photosensitive resist on the surface of a substrate which comprises, as a principal ingredient thereof, a condensation product formed by the condensation reaction between (a) a hydroxydiphenylamine compound represented by the general formula

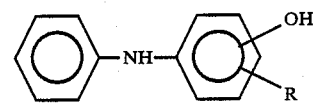

in which R is a hydrogen atom or a hydroxy group, and (b) a melamine compound modified with formaldehyde or a combination of an alcohol and formaldehyde in the presence of an acid catalyst.

2. The undercoating composition as claimed in claim 1 which further comprises a photoextinctive agent having absorptivity of light in the wave length region where the photosensitive resist in the top coat layer has sensitivity to light.

3. An undercoating composition for use as a undercoating layer of a bilayered photoresist film including an undercoating layer and the topcoat layer, said composition comprising a condensation product formed by a condensation reaction in the presence of an acid between a hydroxydiphenylamine compound represented by the formula

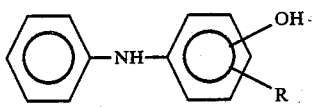

in which R is a hydrogen atom or a hydroxyl group and a melamine compound of the formula

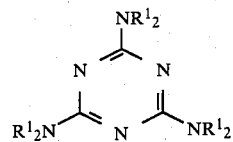

in which $R^1$ is selected from the group consisting of a hydrogen atom, methylol and alkoxymethyl groups, at least one of the groups being methylol or alkoxymethyl, an alkoxy group containing from 1 to 4 carbon atoms, the amount of melamine compound being from 1% to 60% by weight based on the total weight of the hydroxydiphenylamine compound and the melamine compound.

4. A composition as in claim 3 wherein the hydroxydiphenylamine compound is selected from the class consisting of 2-, 3- and 4-hydroxydiphenylamine.

5. A composition as in claim 3 wherein the amount of melamine compound is from 25% to 55% by weight based on the total weight.

6. A composition as in claim 3 wherein the melamine compound contains from 2 to 4 methylol groups.

7. A composition as in claim 3 wherein the melamine compound contains from 1 to 4 alkoxymethyl groups.

* * * * *